(12) United States Patent
Li et al.

(10) Patent No.: US 11,838,724 B2
(45) Date of Patent: Dec. 5, 2023

(54) MEMS MICROPHONE

(71) Applicant: AAC ACOUSTIC TECHNOLOGIES (SHENZHEN) CO., LTD., Shenzhen (CN)

(72) Inventors: Jinyang Li, Shenzhen (CN); Kai Wang, Shenzhen (CN); Zhiyuan Chen, Shenzhen (CN); Rui Zhang, Shenzhen (CN)

(73) Assignee: AAC Acoustic Technologies (Shenzhen) Co., Ltd., Shenzhen (CN)

( * ) Notice: Subject to any disclaimer, the term of this patent is extended or adjusted under 35 U.S.C. 154(b) by 97 days.

(21) Appl. No.: 17/566,637

(22) Filed: Dec. 30, 2021

(65) Prior Publication Data

US 2023/0012074 A1 Jan. 12, 2023

(30) Foreign Application Priority Data

Jul. 7, 2021 (CN) .......................... 202121544339.X

(51) Int. Cl.
*H04R 19/04* (2006.01)
*B81B 3/00* (2006.01)
*H04R 1/04* (2006.01)

(52) U.S. Cl.
CPC ............. *H04R 1/04* (2013.01); *B81B 3/0021* (2013.01); *B81B 2203/0315* (2013.01); *H04R 2201/003* (2013.01)

(58) Field of Classification Search
CPC .... H04R 19/04; H04R 2201/003; H04R 1/04; B81B 3/0021; B81B 2203/0315
See application file for complete search history.

(56) References Cited

U.S. PATENT DOCUMENTS

| 8,295,515 | B2* | 10/2012 | Kuratani | H04R 19/005 |
| | | | | 381/175 |
| 9,491,539 | B2* | 11/2016 | Vos | H04R 31/00 |
| 10,570,007 | B2* | 2/2020 | Lorenz | B81C 1/00301 |
| 2007/0058826 | A1* | 3/2007 | Sawamoto | H04R 19/04 |
| | | | | 381/174 |
| 2010/0322443 | A1* | 12/2010 | Wu | B81B 7/0061 |
| | | | | 381/122 |
| 2011/0062573 | A1* | 3/2011 | Zhe | B81C 1/00309 |
| | | | | 257/E23.079 |
| 2011/0293126 | A1* | 12/2011 | Maekawa | H04R 19/005 |
| | | | | 381/355 |

(Continued)

FOREIGN PATENT DOCUMENTS

| CN | 212486787 U | * | 2/2021 | ............. H04R 19/04 |
| CN | 112954559 A | * | 6/2021 | ........... H04R 19/005 |

*Primary Examiner* — Oyesola C Ojo
(74) *Attorney, Agent, or Firm* — W&G Law Group

(57) ABSTRACT

The present disclosure discloses a MEMS microphone including a printed circuit board, a shell assembled with the printed circuit board for forming a receiving space and provided with a sound hole communicating with the receiving space, a MEMS Die with a cavity accommodated in the receiving space and mounted on the shell for covering the sound hole, and an ASIC chip accommodated in the receiving space and mounted on the shell through a substrate. The cavity of the MEMS Die communicates with the sound hole. The MEMS Die electrically connects with the ASIC chip. The ASIC chip electrically connects with the substrate. The substrate electrically connects with the printed circuit board.

5 Claims, 1 Drawing Sheet

(56) References Cited

U.S. PATENT DOCUMENTS

| | | | |
|---|---|---|---|
| 2014/0161289 A1* | 6/2014 | Pan | B81B 7/0061 |
| | | | 381/174 |
| 2014/0291784 A1* | 10/2014 | Conklin | H04R 1/2807 |
| | | | 257/416 |
| 2014/0367808 A1* | 12/2014 | Kuratani | H04R 19/005 |
| | | | 257/692 |
| 2015/0001646 A1* | 1/2015 | Mueller | H04R 19/04 |
| | | | 257/676 |
| 2015/0117681 A1* | 4/2015 | Watson | H04R 1/04 |
| | | | 381/174 |
| 2015/0315014 A1* | 11/2015 | Protheroe | B81C 1/00309 |
| | | | 257/416 |
| 2016/0052780 A1* | 2/2016 | Liao | B81C 1/0023 |
| | | | 438/51 |
| 2017/0318396 A1* | 11/2017 | Brioschi | H04R 3/005 |
| 2017/0369305 A1* | 12/2017 | Suvanto | B81B 7/008 |

* cited by examiner

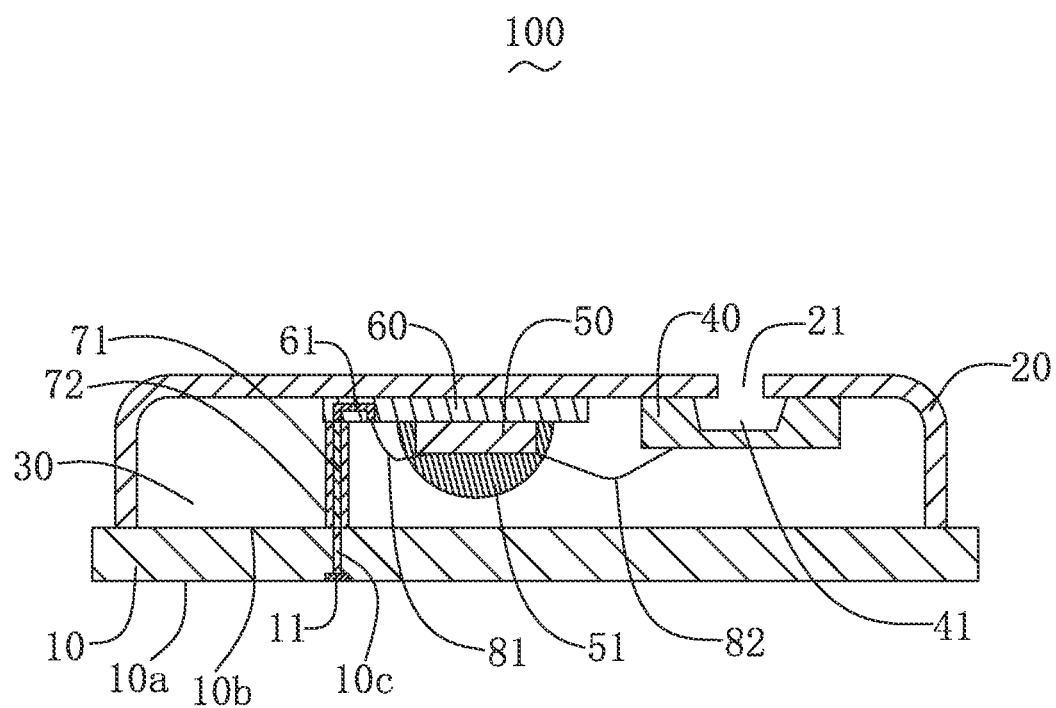

MEMS MICROPHONE

FIELD OF THE PRESENT DISCLOSURE

The present disclosure relates to microphones, in particular to a micro-electro-mechanical system (MEMS) microphone.

DESCRIPTION OF RELATED ART

With the development of wireless communications, mobile phones are increasing. The requirements for mobile phones are not only to make calls, but also to be able to provide high-quality call effects. Especially, with the popularization of the mobile multimedia, the quality of the calls is more and more important. The microphone used as a voice pickup device of the mobile phone directly affects the quality of the calls. Currently, MEMS microphones are the most widely used.

A MEMS microphone in the related art includes a printed circuit board, a shell assembled with the printed circuit board, an ASIC chip mounted on the printed circuit board, and a MEMS Die with a cavity mounted on the printed circuit board. The shell has a sound hole for receiving external sounds. The printed circuit board encloses the cavity of the MEMS Die for making the cavity serve as a rear cavity of the MEMS microphone. The related MEMS microphone has a small rear cavity, thereby causing a lower SNR and seriously limiting the performance.

Thus, it is necessary to provide a novel MEMS microphone to solve the problem.

SUMMARY OF THE DISCLOSURE

A MEMS microphone disclosed in the present disclosure includes a printed circuit board, a shell assembled with the printed circuit board for forming a receiving space and provided with a sound hole communicating with the receiving space, a MEMS Die with a cavity accommodated in the receiving space and mounted on the shell for covering the sound hole, and an ASIC chip accommodated in the receiving space and mounted on the shell through a substrate. The cavity of the MEMS Die communicates with the sound hole. The MEMS Die electrically connects with the ASIC chip. The ASIC chip electrically connects with the substrate. The substrate electrically connects with the printed circuit board.

Further, the shell is made of a metal material.

Further, the MEMS microphone includes a conductive pillar electrically connecting the printed circuit board and the substrate.

Further, the MEMS microphone includes an insulating connection bridge wrapping the conductive pillar. The insulating connection bridge connects the printed circuit board and the substrate.

Further, the MEMS microphone includes a first bond wire. The substrate is provided with a conductive path therein. The conductive path electrically connects with the conductive pillar. The first bond wire electrically connects the ASIC chip and the conductive path.

Further, the printed circuit board is provided with a bond pad on an outer surface thereof. The conductive pillar connects with an inner surface of the printed circuit board and electrically connects with the bond pad through an inner circuit of the printed circuit board.

Further, the MEMS microphone includes a second bond wire. The second bond wire electrically connects the MEMS Die and the ASIC chip.

BRIEF DESCRIPTION OF THE DRAWINGS

Many aspects of the exemplary embodiment can be better understood with reference to the following drawings. The components in the drawing are not necessarily drawn to scale, the emphasis instead being placed upon clearly illustrating the principles of the present disclosure.

FIG. 1 is a cross-sectional view of a MEMS microphone in accordance with an exemplary embodiment of the present disclosure.

DETAILED DESCRIPTION OF THE EXEMPLARY EMBODIMENT

The present disclosure will hereinafter be described in detail with reference to an exemplary embodiment. To make the technical problems to be solved, and technical solutions and beneficial effects of the present disclosure more apparent, the present disclosure is described in further detail together with the FIG. and the embodiment. It should be understood the specific embodiment described hereby is only to explain the disclosure, not intended to limit the disclosure.

Referring to FIG. 1, the present disclosure discloses a MEMS microphone 100, which includes a printed circuit board 10, a shell 20 assembled with the printed circuit board 10 for forming a receiving space 30, a MEMS Die 40 accommodated in the receiving space 30, and an ASIC chip 50 accommodated in the receiving space 30. Optionally, the shell 20 is made of a metal material, since a metal shell has a strong structural strength and is benefit to realize electromagnetic shielding.

The shell 20 is provided with a sound hole 21 communicating with the receiving space 30. The MEMS Die 40 is mounted on the shell 20 and covers the sound hole 21. The MEMS Die 40 has a cavity 41 communicating with the sound hole 21. The MEMS Die 40 divides the receiving space 30 into a front cavity and a rear cavity of the MEMS microphone 100. The cavity 41 of the MEMS Die 40 serves as the front cavity of the MEMS microphone 100, the rest of the receiving space 30 enclosed by the MEMS Die 40, the shell 20 and the printed circuit board 10 serves as the rear cavity of the MEMS microphone 100. Thus, the MEMS microphone 100 has a smaller front cavity and a larger rear cavity, thereby, greatly improving the sensitivity and enhancing the performance.

The ASIC chip 50 is mounted on the shell 20 through a substrate 60. Optionally, the substrate 60 is glued to the shell 20. The substrate 60 electrically connects with the printed circuit board 10 through a conductive pillar 71. The substrate 60 is provided with a conductive path 61 therein, and it may choose a printed circuit board. The conductive path 61 electrically connects with the conductive pillar 71. The ASIC chip 50 electrically connects with the conductive path 61 through a first bond wire 81. The printed circuit board 10 is provided with a bond pad 11 on an outer surface 10a thereof, the bond pad 11 is used to electrically connect with an external circuit, the conductive pillar 71 connects with an inner surface 10b of the printed circuit board 10 and electrically connects with the bond pad 11 through an inner circuit 10c of the printed circuit board 10. Thus, the ASIC chip 50 realize electrical connection with an external circuit sequentially through the first bond wire 81, the conductive path 61, the conductive pillar 71, the inner circuit 10c and the bond pad 11. The MEMS Die 40 electrically connects with the ASIC chip 50 through a second bond wire 82. Thus, the MEMS microphone 100 has a simple structure for realizing electrical connection.

Optionally, the MEMS microphone 100 further includes an insulating connection bridge 72. The insulating connection bridge 72 connects the printed circuit board 10 and the substrate 60, so that the insulating connection bridge 72 wraps the conductive pillar 71 for preventing the conductive pillar 71 from damages.

Optionally, the ASIC chip 50 is wrapped with an encapsulating material 51 for preventing the ASIC chip 50 from the influences of temperature and humidity of external environment, static electricity, heat, particles, light and other factors.

Compared with the related art, the MEMS microphone 100 has a smaller front cavity and a larger rear cavity, thereby, greatly improving the sensitivity and enhancing the performance. Besides, the MEMS microphone 100 has a simple structure for realizing electrical connection and a lower cost.

It is to be understood, however, that even though numerous characteristics and advantages of the present exemplary embodiment have been set forth in the foregoing description, together with details of the structures and functions of the embodiments, the disclosure is illustrative only, and changes may be made in detail, especially in matters of shape, size, and arrangement of parts within the principles of the disclosure to the full extent indicated by the broad general meaning of the terms where the appended claims are expressed.

What is claimed is:

1. A MEMS microphone, comprising:
   a printed circuit board;
   a shell assembled with the printed circuit board for forming a receiving space, provided with a sound hole communicating with the receiving space;
   a MEMS Die with a cavity, accommodated in the receiving space and mounted on the shell for covering the sound hole;
   an ASIC chip, accommodated in the receiving space and mounted on the shell through a substrate;
   a conductive pillar electrically connecting the printed circuit board and the substrate; and
   a first bond wire;
   wherein
   the cavity of the MEMS Die communicates with the sound hole, the MEMS Die electrically connects with the ASIC chip, the ASIC chip electrically connects with the substrate, the substrate electrically connects with the printed circuit board, the substrate is provided with a conductive path therein, the conductive path electrically connects with the conductive pillar, the first bond wire electrically connects the ASIC chip and the conductive path.

2. The MEMS microphone as described in claim 1, wherein the shell is made of a metal material.

3. The MEMS microphone as described in claim 1, further comprising an insulating connection bridge wrapping the conductive pillar, the insulating connection bridge connecting the printed circuit board and the substrate.

4. The MEMS microphone as described in claim 1, wherein the printed circuit board is provided with a bond pad on an outer surface thereof, the conductive pillar connects with an inner surface of the printed circuit board and electrically connects with the bond pad through an inner circuit of the printed circuit board.

5. The MEMS microphone as described in claim 1, further comprising a second bond wire, the second bond wire electrically connecting the MEMS Die and the ASIC chip.

* * * * *